United States Patent
Tsironis

(10) Patent No.: US 10,693,437 B1
(45) Date of Patent: Jun. 23, 2020

(54) HIGH GAMMA ON-WAFER LOAD PULL TEST SYSTEM

(71) Applicant: Christos Tsironis, Dollard-des-Ormeaux (CA)

(72) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 16/254,720

(22) Filed: Jan. 23, 2019

Related U.S. Application Data

(60) Provisional application No. 62/621,223, filed on Jan. 24, 2018.

(51) Int. Cl.
| | |
|---|---|
| *H03H 7/38* | (2006.01) |
| *H03H 7/40* | (2006.01) |
| *G01R 27/32* | (2006.01) |
| *H03H 17/00* | (2006.01) |

(52) U.S. Cl.
CPC ............... *H03H 7/40* (2013.01); *G01R 27/32* (2013.01); *H03H 17/0045* (2013.01)

(58) Field of Classification Search
CPC ... H03H 7/38; H03H 7/40; H01P 1/18; G01R 27/2694; G01R 27/02; G01R 25/02
USPC ................................... 333/17.3, 32, 33, 263
See application file for complete search history.

(56) References Cited

U.S. PATENT DOCUMENTS

| | | |
|---|---|---|
| 6,674,293 B1 | 1/2004 | Tsironis |
| 9,257,963 B1 | 2/2016 | Tsironis |
| 2003/0107363 A1* | 6/2003 | Tsironis ............. G01R 31/2822 324/95 |

OTHER PUBLICATIONS

Load Pull [online], Wikipedia [retrieved on Nov. 18, 2016], Retrieved from Internet <URL:https://en.wikipedia.org/wiki/Load_pull>.
(Continued)

*Primary Examiner* — Stephen E. Jones

(57) ABSTRACT

A millimeter-wave, high GAMMA on-wafer load pull system uses a tuner with extended inclined slabline (bend-line) and a manually controlled low profile pre-matching module, mounted on the bent section of the slabline next to the wafer-probe. The pre-matching module uses a mobile sliding rack and a rotating tuning probe; the rack is mounted on the slabline extension and controlled by a fixed pinion. Both the rack and tuning probe position and immersion into the slabline are controlled using sidewise mounted easily accessible manual knobs. The low profile of the pre-matching module is a crucial feature and allows integration on the extended slabline of the tuner in immediate proximity of the wafer-probe, thus minimizing any additional insertion loss and maximizing tuning range. Manual handling of the pre-matching tuning module is easy and a pre-calibration allows efficient on-wafer load pull operations.

7 Claims, 19 Drawing Sheets

(56) References Cited

OTHER PUBLICATIONS

"Multipurpose Tuners Control Impedances from 20 to 110 GHz", MW&RF Magazine, Mar. 2017.
"Integrated Load Pull System, ILPS", Product Note 47, Focus Microwaves, Dec. 1997.
"Calibration Techniques of Network Analyzers for Tuner Characterization", Application Note 13, Focus Microwaves, May 1994.
"Computer Controlled Microwave Tuner—CCMT", Product Note 41, Focus Microwaves, Jan. 1998.
Standing wave ratio, VSWR [online], Wikipedia [retrieved Mar. 2, 2017], Retrieved from Internet <URL:http://en.wikipedia.org/wiki/Standing_wave_ratio>.
"TITAN TM Probe Technologies", [online] MPI Corporation [Retrieved on Dec. 23, 2017] Retrieved from Internet <URL:http://www.mpi-corporation.com/ast/mpi-rf-probes-accessories/titan-probe-technologies/>.

\* cited by examiner

FIG.8A: Prior art
FIG. 8B: Prior art
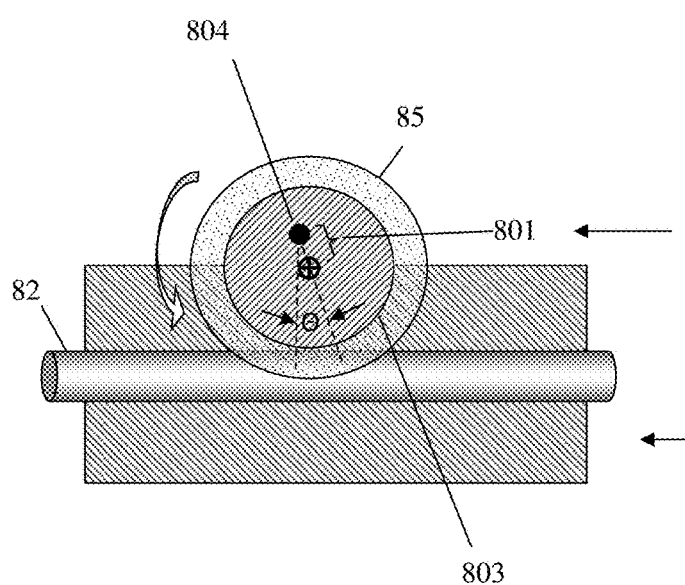
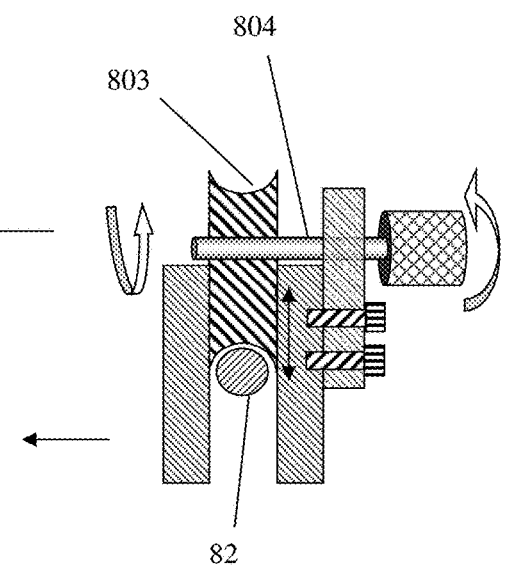

FIG. 14: Prior art

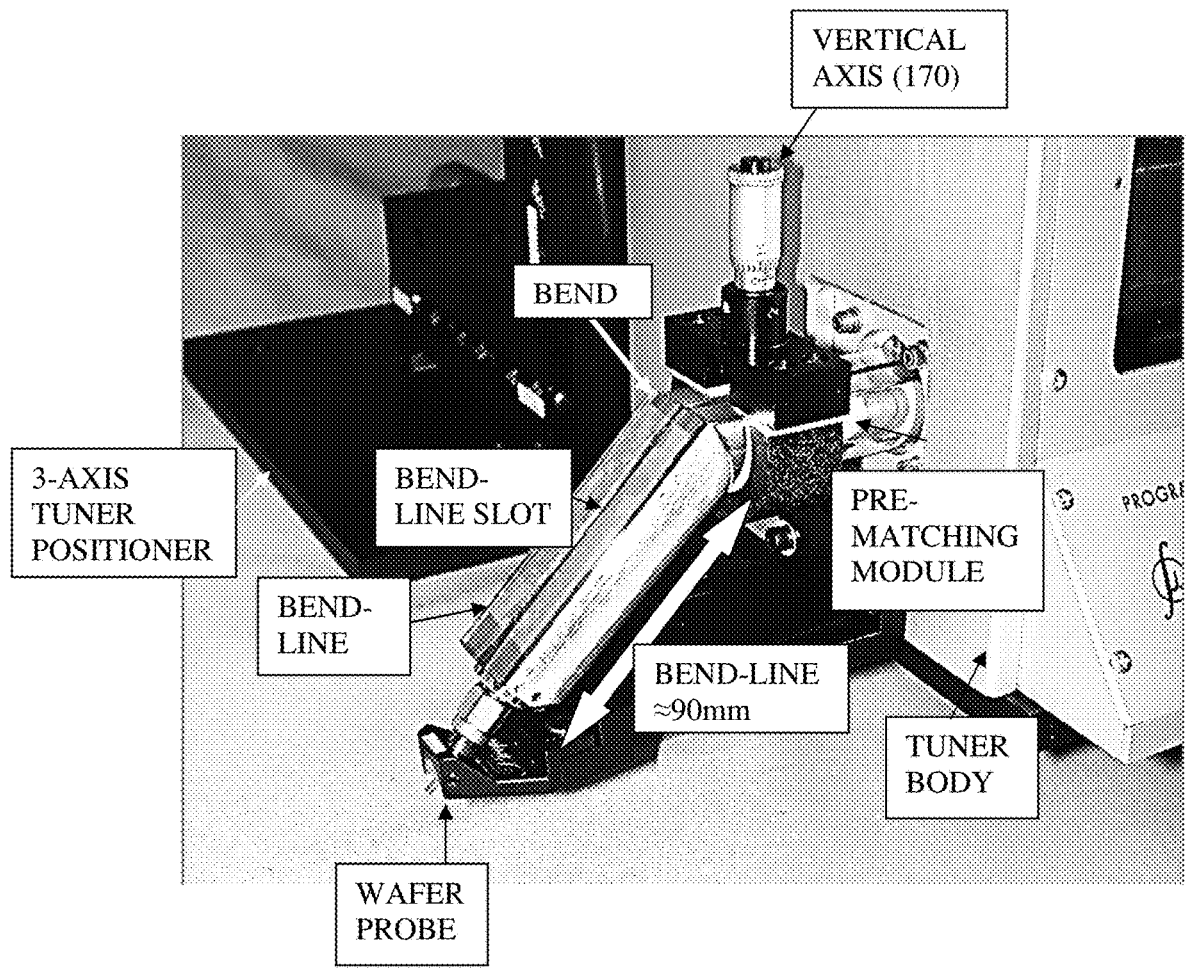
FIG. 17: Prior art, prototype, unpublished

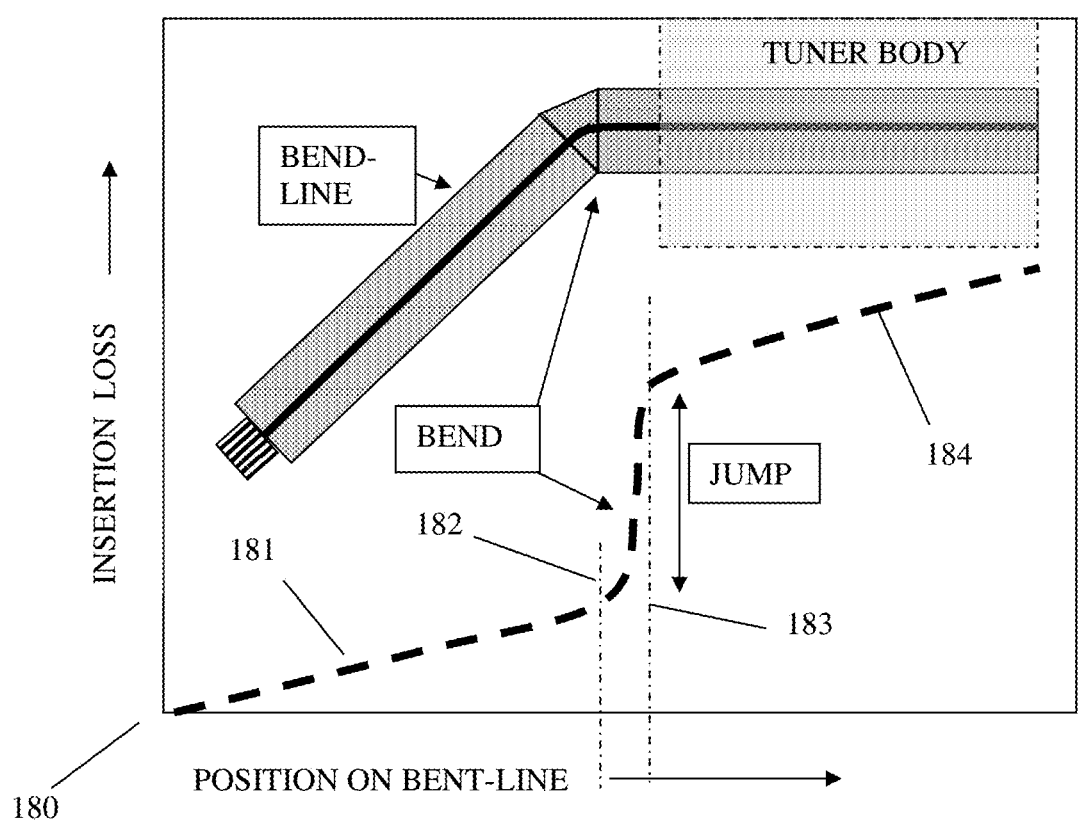
FIG. 18: Prior art

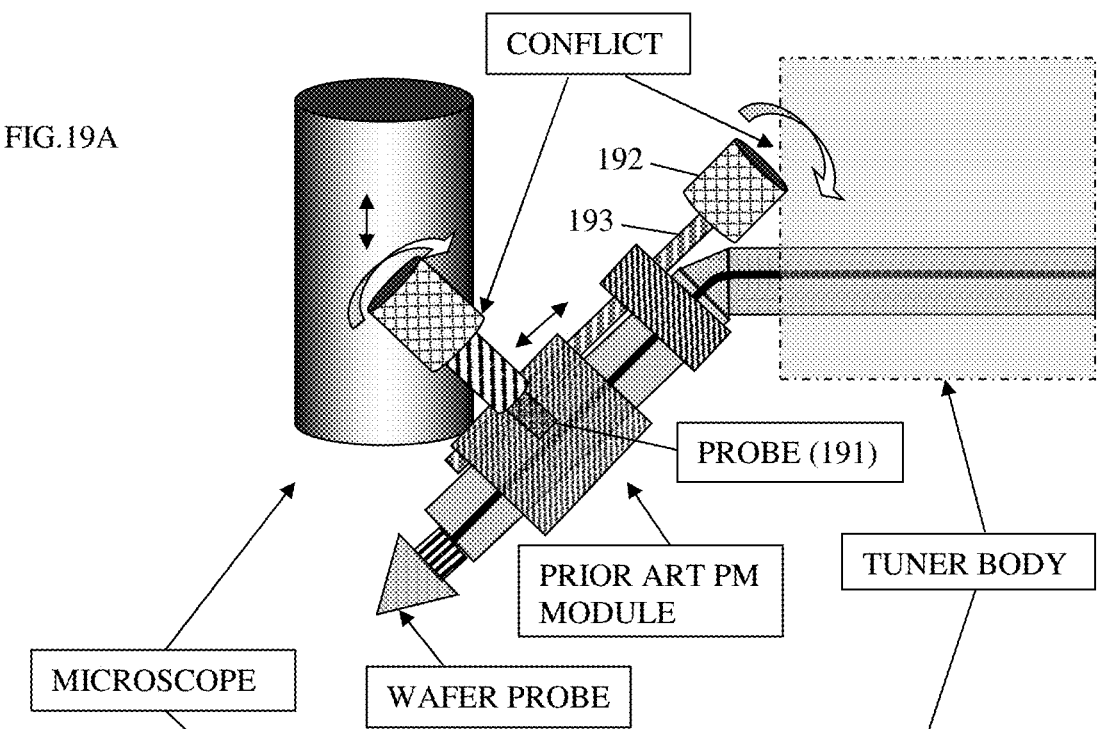
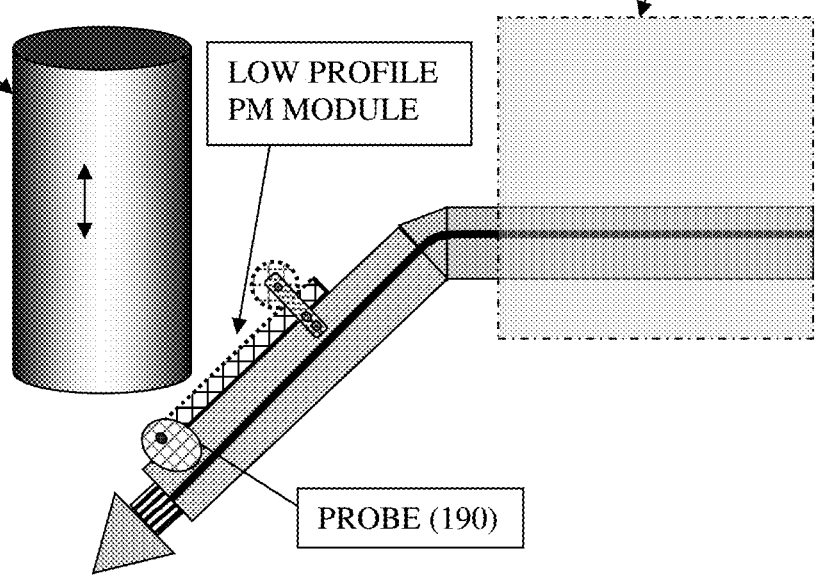

HIGH GAMMA ON-WAFER LOAD PULL TEST SYSTEM

PRIORITY CLAIM

This application claims priority on provisional application 62/621,223, filed on Jan. 24, 2018, named "MILLIMETER-WAVE ON-WAFER LOAD PULL SYSTEM".

CROSS-REFERENCE TO RELATED ARTICLES

1. "Load Pull", [online], Wikipedia [Retrieved on Nov. 18, 2016] Retrieved from Internet <URL:http://en.wikipedia.org/wiki/Load_pull>.
2. TSIRONIS, U.S. Pat. No. 6,674,293, "Adaptable Pre-matched Tuner System and Method".
3. "Multipurpose Tuners Control Impedances from 20 to 110 GHz", MW&RF Magazine, March 2017.
4. TSIRONIS, U.S. Pat. No. 9,257,963, "Impedance Tuners with Rotating Probes".
5. "Integrated Load Pull System, ILPS", Product Note 47, Focus Microwaves, December 1997.
6. "Calibration Techniques of Network Analyzers for Tuner Characterization", Application Note 13, Focus Microwaves, May 1994.
7. "Computer Controlled Microwave Tuner—CCMT", Product Note 41, Focus Microwaves, January 1998.
8. Standing wave ratio, VSWR [online], Wikipedia [retrieved Mar. 2, 2017], Retrieved from Internet <URL: http://en.wikipedia.org/wiki/Standing_wave_ratio>.
9. "TITAN™ Probe Technologies", [online] MPI Corporation [Retrieved on Dec. 23, 2017] Retrieved from Internet <URL:http://www.mpi-corporation.com/ast/mpi-rf-probes-accessories/titan-probe-technologies/>.

BACKGROUND OF THE INVENTION

This invention relates to load and source pull testing of medium and high-power millimeter-wave (mm-wave) transistors and amplifiers.

Design of modern low noise or high-power mm-wave amplifiers and mixers, used in various communication systems, requires accurate knowledge of the active device's characteristics. In such circuits, it is insufficient for the transistors (device under test, DUT), which operate either as highly non-linear devices, close to power saturation, or at minimum noise conditions, to be described using linear (noise) or non-linear (power) numeric models.

A popular method for testing and characterizing such microwave components (transistors) in the non-linear region of operation is "load pull" or "source pull". Load/Source pull (see ref. 1) is a measurement technique employing microwave impedance tuners and other microwave test equipment (FIG. 1), such as signal source 1, input and output impedance tuners 2, 4, (see ref. 7), power meter 5 and test fixture 3, which houses the DUT. In millimeter-wave frequencies (between 20 or 30 and 100 GHz) test fixtures are typically replaced by wafer-probes, allowing direct and low parasitic access to the semiconductor chips; other types of fixtures have too many parasitic components (packages, stray capacitors, bonding wires and lead inductors) that would mask strongly the real device. The tuners and test equipment are controlled by a computer 6 via digital cables 7, 8 and 9. The impedance tuners are instruments which allow manipulating the impedance presented to the Device Under Test (DUT) (see ref. 1) while testing and registering its behavior; this document refers hence to "impedance tuners", in order to make a clear distinction to "tuned receivers (radios)", popularly called elsewhere also "tuners" because of the included tuning circuits (see ref. 2).

When an automated electro-mechanical tuner is used in a setup as shown in FIG. 1, we speak of a passive load pull system. The typical configuration of the reflective probe inside the slabline is shown in FIG. 2: a reflective tuning element 21 also called "tuning" probe or slug, is inserted into the slotted transmission airline 24 and coupled capacitively with the center conductor 23 to an adjustable degree, depending from very weak 26 (when the probe is withdrawn) to very strong (when the probe is very close (within electric discharge—or Corona) to the center conductor 23; when the tuning probe moves vertically 26 between a "top position" and a "bottom position" and approaches the center conductor 23 and moves along the axis 25 of the slabline, it controls the amplitude and phase of the reflection factor seen at the slabline ports reaching areas covering parts or the totality of the Smith chart (the normalized reflection factor area). The relation between reflection factor GAMMA=|GAMMA|*exp(jΦ) and impedance Z is given by GAMMA=(Z−Zo)/(Z+Zo), where Z is the complex impedance Z=R+jX associated with GAMMA and Zo is the characteristic impedance of the system and slabline. A typical value used for Zo is 50 Ohms.

The tuning range (i.e. the capacity to reach the periphery of the Smith chart, or R=0 Ohm) of such a system is limited, essentially because of unavoidable insertion loss between the tuner and the DUT (FIGS. 1, 5 and 14), which means the passive tuner in the load pull system would, due to insertion loss, not reach the conjugate complex internal impedance and power-match many high power transistors, which have a small internal impedance (marked as "DUT" in FIG. 11 and "Conjugate complex DUT" in FIG. 5). To increase the tuning range of such a system one needs: (a) to reduce the insertion loss of the connection between DUT and tuner (FIG. 1) and (b) to insert, as close to the DUT as possible a pre-matching function (see ref. 2, FIG. 7 and FIG. 10). These two requirements translate into (a) a tuner airline (slabline) that extends beyond the tuner body and matches the angle of the wafer-probe (FIGS. 6, 13 and 15) allowing reducing the insertion loss and (b) a pre-matching module, which increases the tuning range at selected angles (FIG. 11).

Mechanical slide screw impedance tuners (FIG. 2 and FIG. 3) in the RF-microwave and millimeter-wave frequency range between 100 MHz and 110 GHz (see ref. 3, millimeter-wave frequencies are, typically, considered frequencies where the wave-length λ is best described in millimeters (mm); i.e. above 20 or 30 GHz (λ=300 mm/Freq (GHz), leading to λ(20 GHz)=15 mm and λ(30 GHz)=10 mm, and up to 110 GHz, λ=2.72 mm) are using the slide-screw concept and include a slabline 24, 30 with a test port 36 and an idle port 37, a center conductor 23, 31 (FIG. 3) and one or more mobile carriages 33 which carry a micrometric screw attached to a vertical axis 34 with manual handle or automatic (motor) control 35 which controls the vertical position of a reflective probe 32. The carriages are moved horizontally by additional manual handle or automatic (motor) control 37 and gear (ACME rod) 38. The signal enters one port and exits from the other. In load pull the test port is 36 where the signal enters, in source pull the test port is 39 where the signal exits. The typical configuration of the reflective probe 21 inside the slabline 24 is shown in FIG. 2. It requires a precise vertical axis 34 controlled by a micrometric screw 35. In the case of a manual pre-matching module however, the control is through a micrometric screw 170 in FIG. 17; pre-matching modules as in FIG. 17 cannot be integrated on the extended slabline (FIGS. 6 and 15) since the long vertical axis 34 with associated control screw 35 will conflict with the microscope (FIG. 19A); therefore pre-matching modules as in FIG. 17 cannot be mounted very close to the wafer-probe on the inclined portion of the slabline. The module will conflict mechanically with the microscope (area marked "CONFLICT AREA 63 in FIGS. 6 and 1502 in FIG. 15); therefore, the vertical axis, which is the main obstacle to the integration, must be eliminated.

BRIEF DESCRIPTION OF THE INVENTION

Using a rotating reflective disc probe 71, 85 shown in FIGS. 7 and 8 (see ref. 4) allows eliminating the long vertical axis and the conflict with the microscope. The additional conflict with the tuner housing, when using a knob 192 and ACME rod 193 to control the lateral movement of the probe housing must also be avoided. The eccentric rotation 801 of the disc-probe 85 approaches the concave bottom 803 of the probe to the center conductor 82 or pulls it away from it; this creates the adjustability of the amplitude |GAMMA| of the reflection factor as a function of the angle Θ without the need of the cumbersome long vertical axis 34 and control 35 mechanism. Horizontal movement of the probe in prior art manual tuners is done using an ACME rod 38 attached to a handle 37, or the corresponding combination ACME rod 193 and handle 192; again this configuration requires a bulky carriage 33 and manual access from the front or the back 37 of the extended slabline 93 in FIG. 9, towards the wafer-probe 92 or the tuner body 90, which, in an integrated setup, is quasi impossible; the solution employed in this invention uses a mobile rack 72, 95, shown in FIGS. 7 and 9, which is pushed or pulled along the slabline using an immobilized pinion 73, 103, shown in FIGS. 7 and 10, with an axis fixed against the slabline using the bracket 77, 901; again, other than typically implemented, the pinion is not travelling on the rack, instead the pinion is fixed on the bracket and the rack travels/slides 78, 98. The axis 79 of the rotating probe 71 is inserted into a perpendicular hole at the end of the rack 72 and moves horizontally 78 with the rack 72 on top and along the slabline 74, controlling this way the phase F of the reflection factor GAMMA=|GAMMA|*exp(jΦ).

BRIEF DESCRIPTION OF THE SEVERAL VIEWS OF THE DRAWINGS

The invention and its mode of operation will be more clearly understood from the following detailed description when read with the appended drawings in which:

FIG. 8A through 8B depict prior art: the concept of a disc tuning probe: FIG. 8A depicts a front view; FIG. 8B depicts a cross section.

All dotted traces are a generated by horizontal probe movement only.

Figure 12:
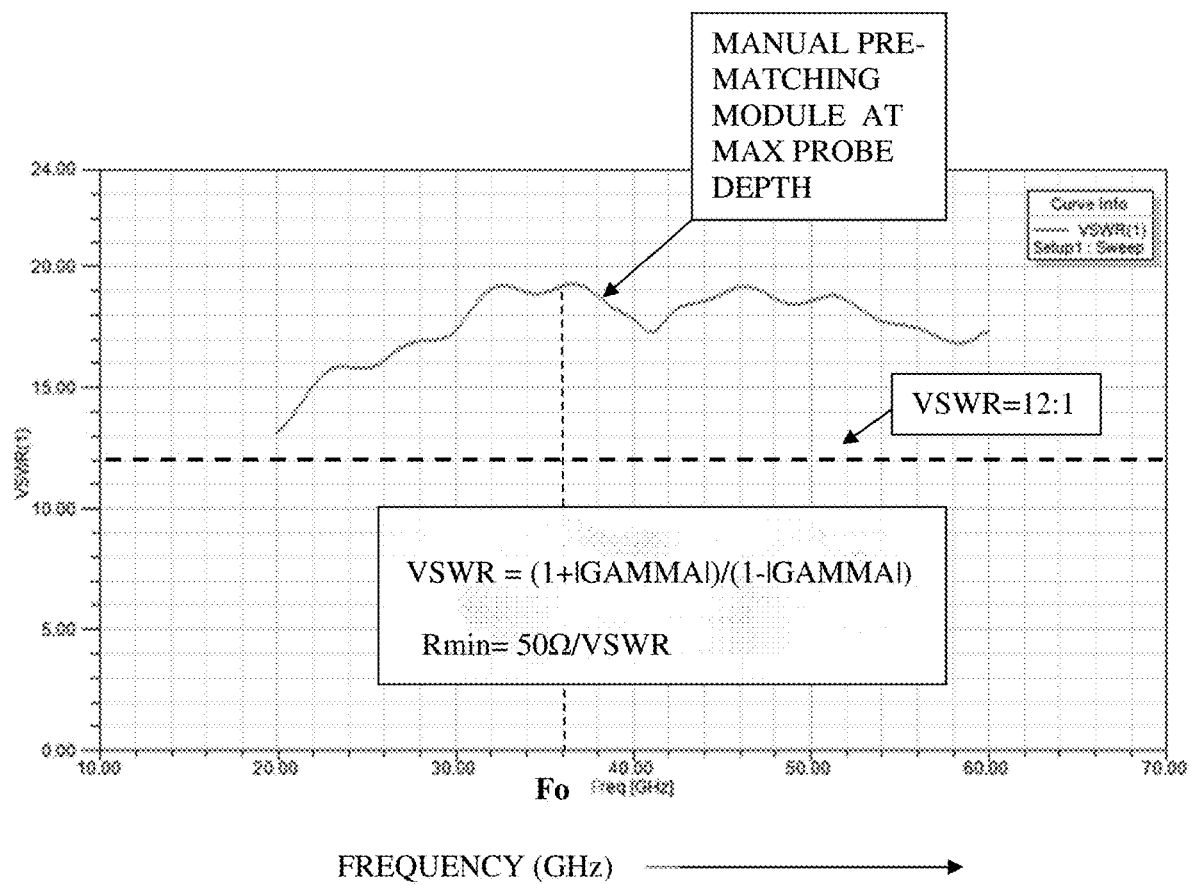

FIG. 12 depicts maximum reflection factor of manual pre-matching module from 20 to 60 GHz, easily extendable to 67 GHz.

Figure 13:
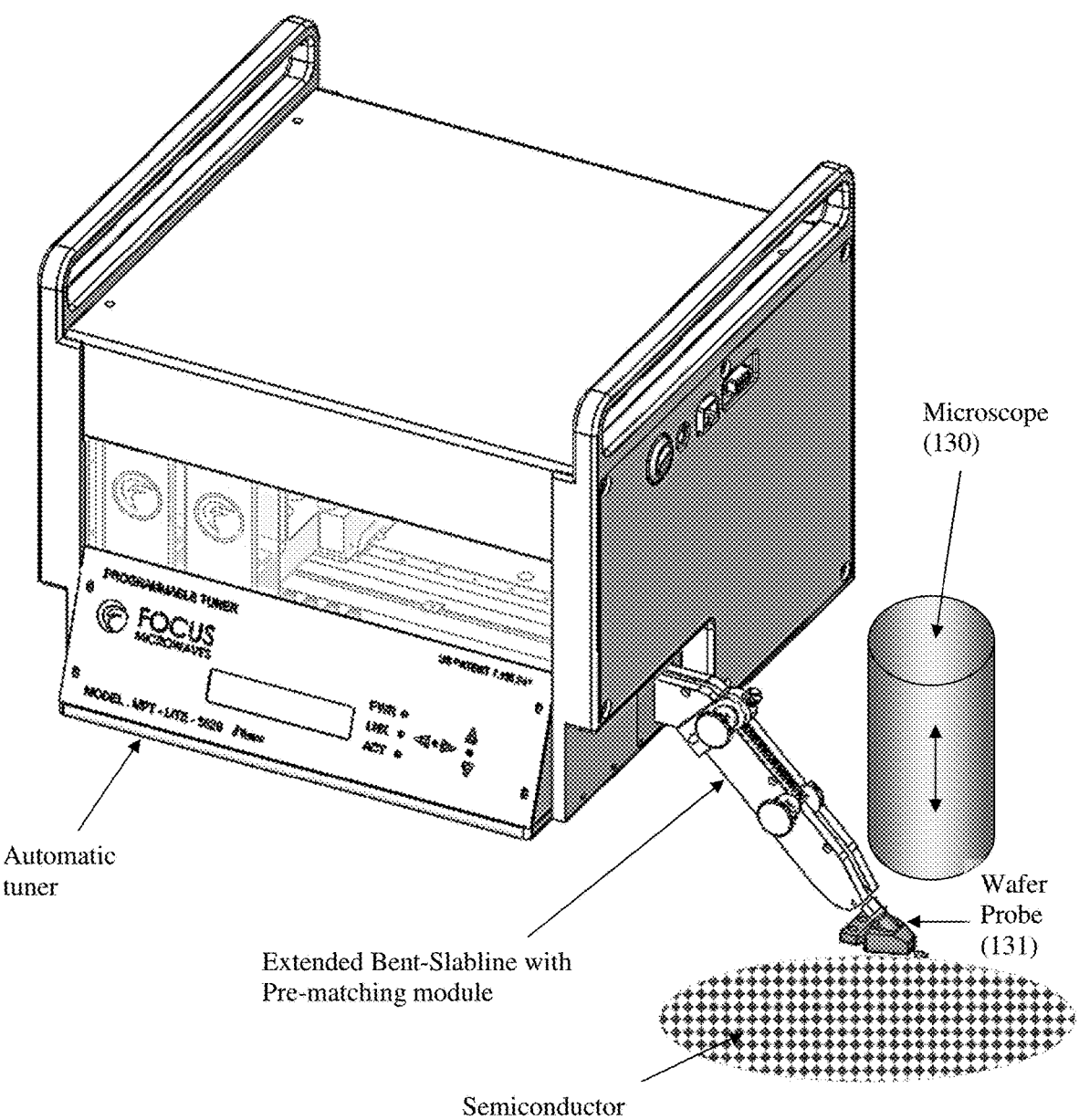

FIG. 13 depicts automatic tuner with extended bend-line and integrated manual pre-matching module in on-wafer operation.

Figure 14:
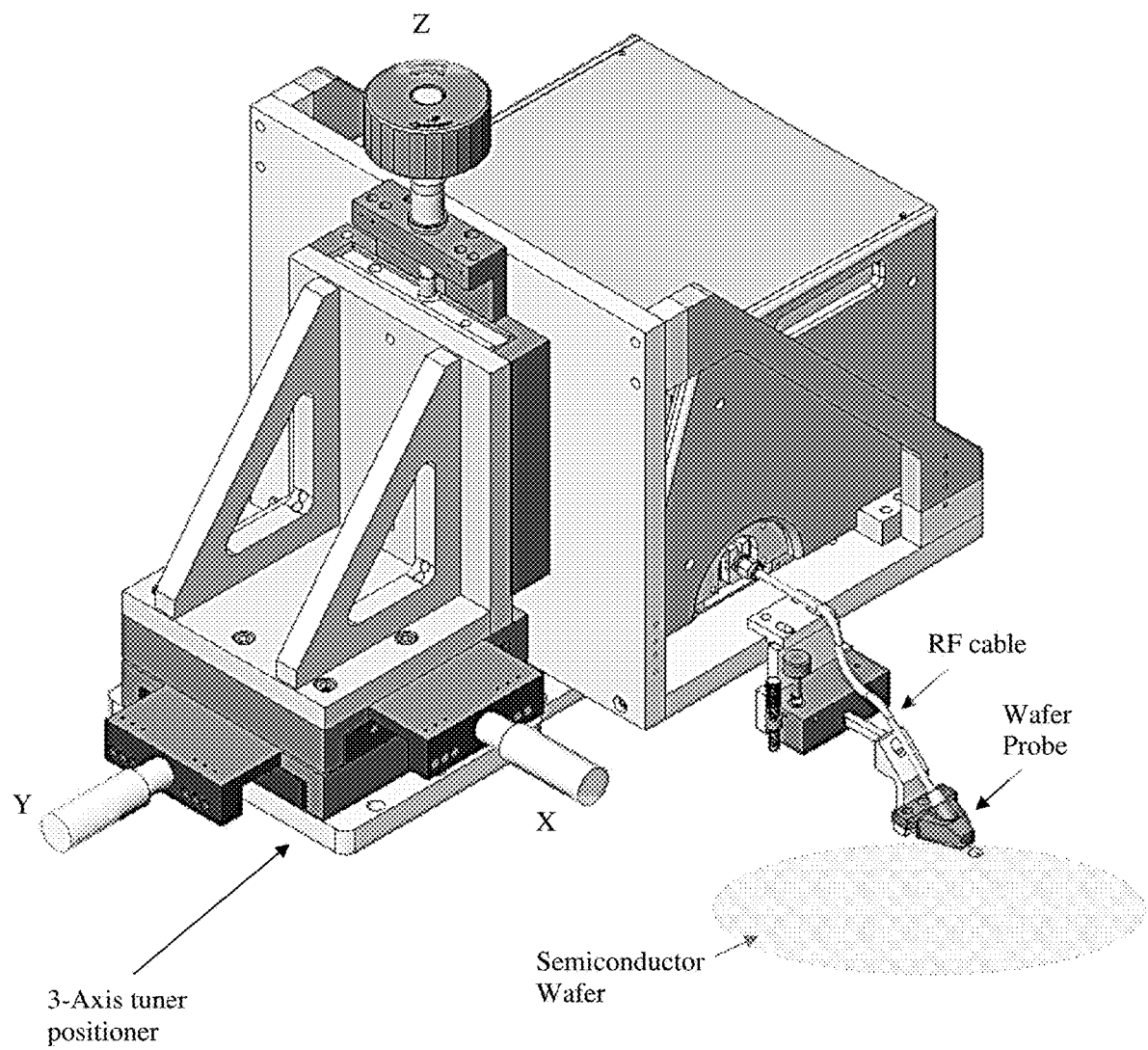

FIG. 14 depicts prior art, a tuner mounted on 3-axis positioner in on-wafer operation using flexible or semirigid RF cable connecting to the wafer-probe.

Figure 15:
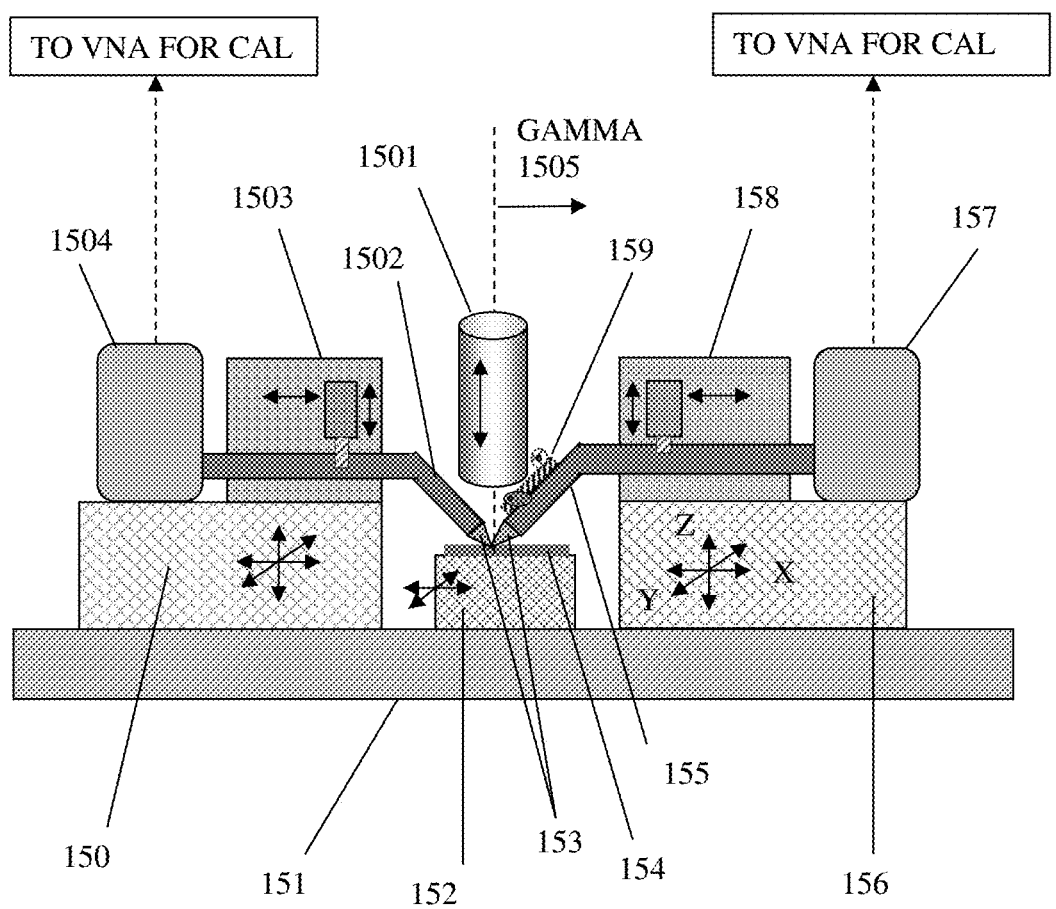

FIG. 15 depicts the details of the on-wafer load-pull integration of the tuner with pre-matching module incorporated in the bend-line and the area of previous conflict with the microscope.

Figure 16:
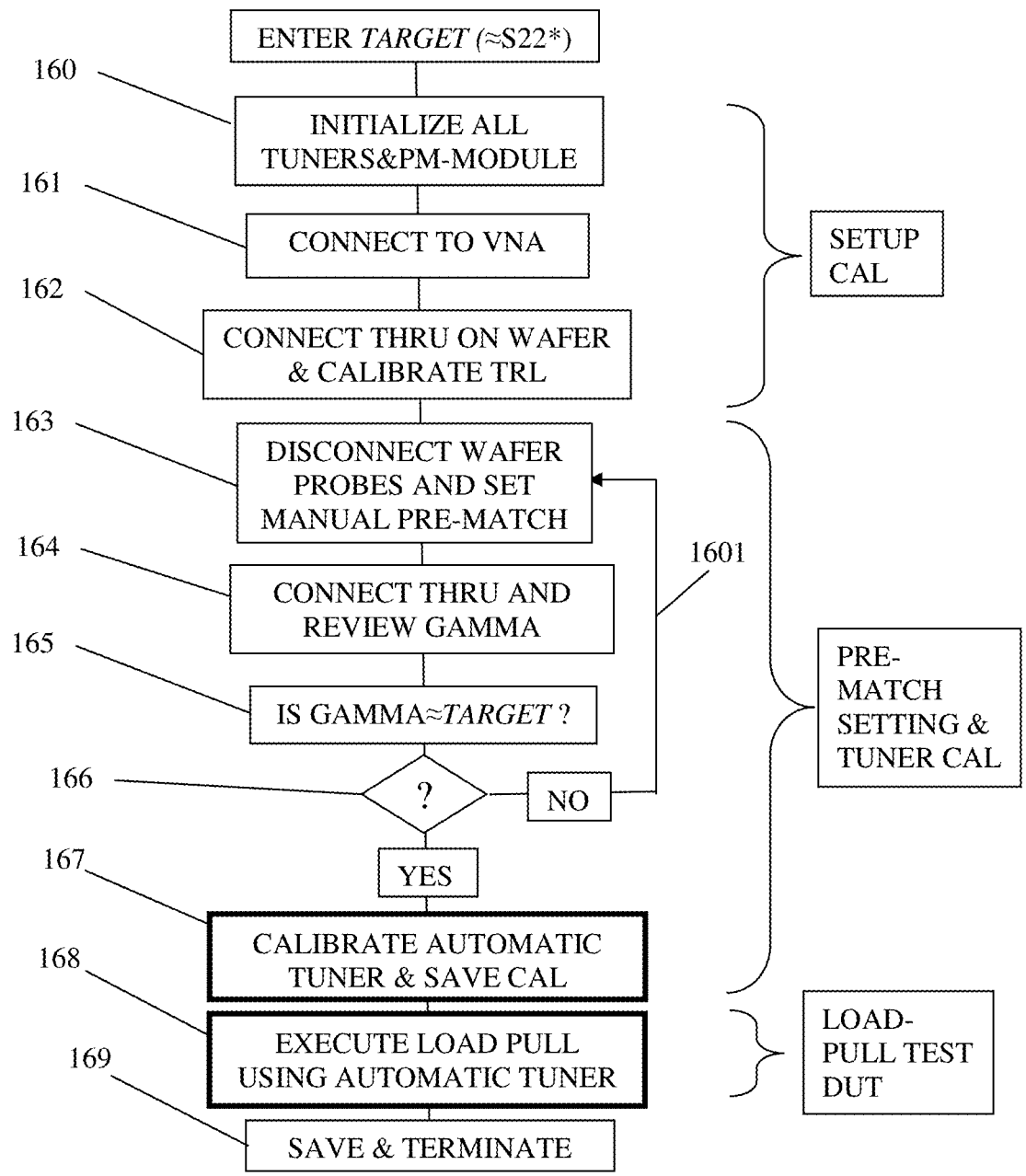

FIG. 16 depicts the flowchart of the setting and calibration algorithm of the pre-matched tuner on-wafer.

FIG. 17 depicts prior art: unpublished photograph of prototype of pre-matching module integrated on a bend-line between tuner and bend.

FIG. 18 depicts prior art: insertion loss of a bend-line as a function of distance from the wafer-probe.

FIG. 19A through 19B depict the situation with mechanical conflict of a prior art manual pre-matching module and a microscope and the benefits of the invention: FIG. 19A depicts prior art; the normal profile pre-matching module cannot be mounted on the bend-line; FIG. 19B depicts the low profile pre-matching module being, instead, compatible with the microscope.

DETAILED DESCRIPTION OF THE INVENTION

Figure 6:
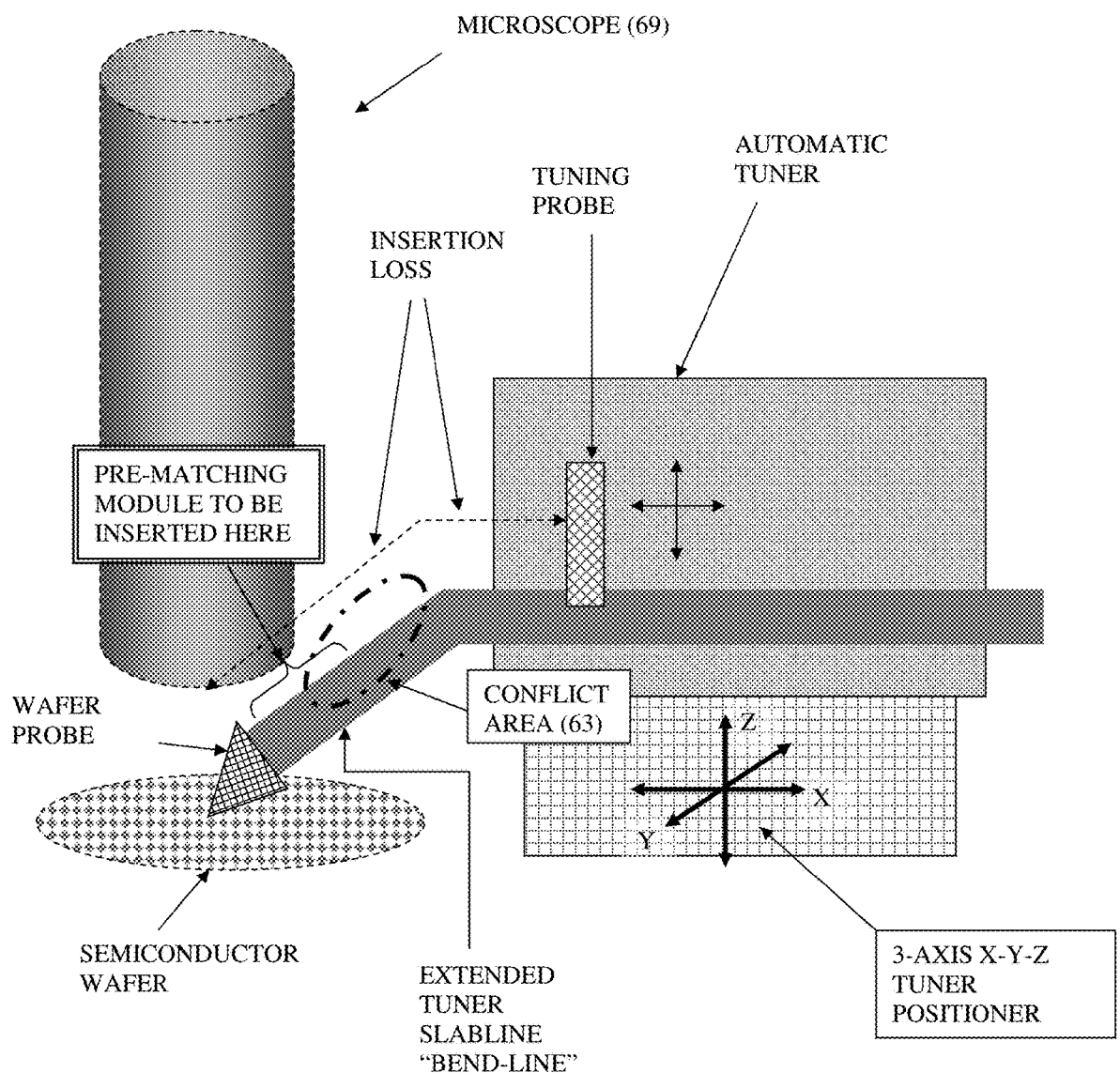
FIG. 6 depicts prior art: on-wafer load pull system using a tuner with extended bend-line mounted on 3 axis positioner.
Figure 7:
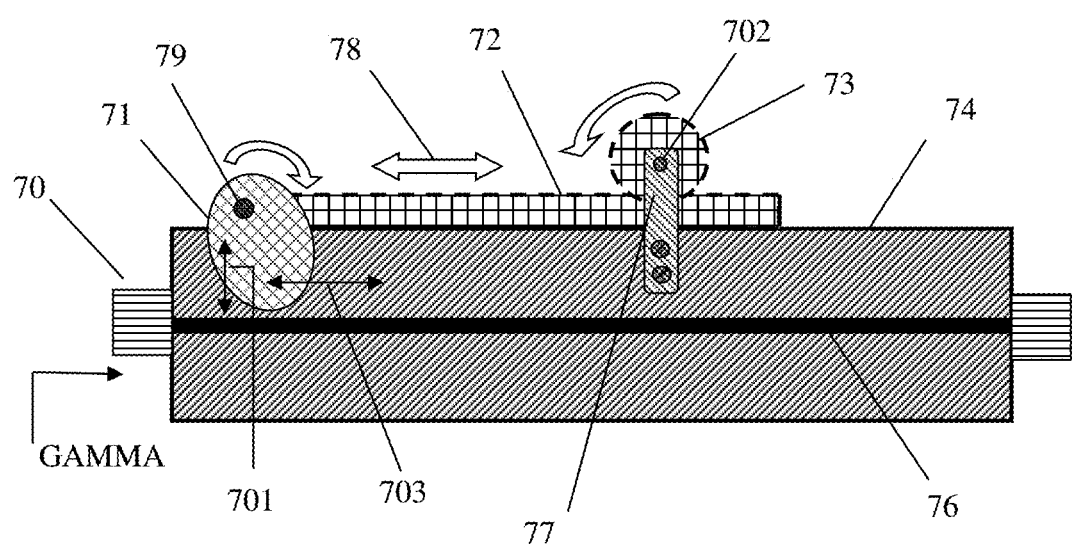
FIG. 7 depicts the concept of a low-profile rack-and-pinion based pre-matching module.

The purpose for this invention is: (a) to increase the overall tuning range using pre-match (FIG. 11) and to do so (b) to create an automated calibrated on-wafer load-pull test system by integrating the pre-matching device as close to the wafer-probe (see ref. 9) as possible (FIGS. 6 and 15) and (c) devise an appropriate system calibration method.

Figure 1:
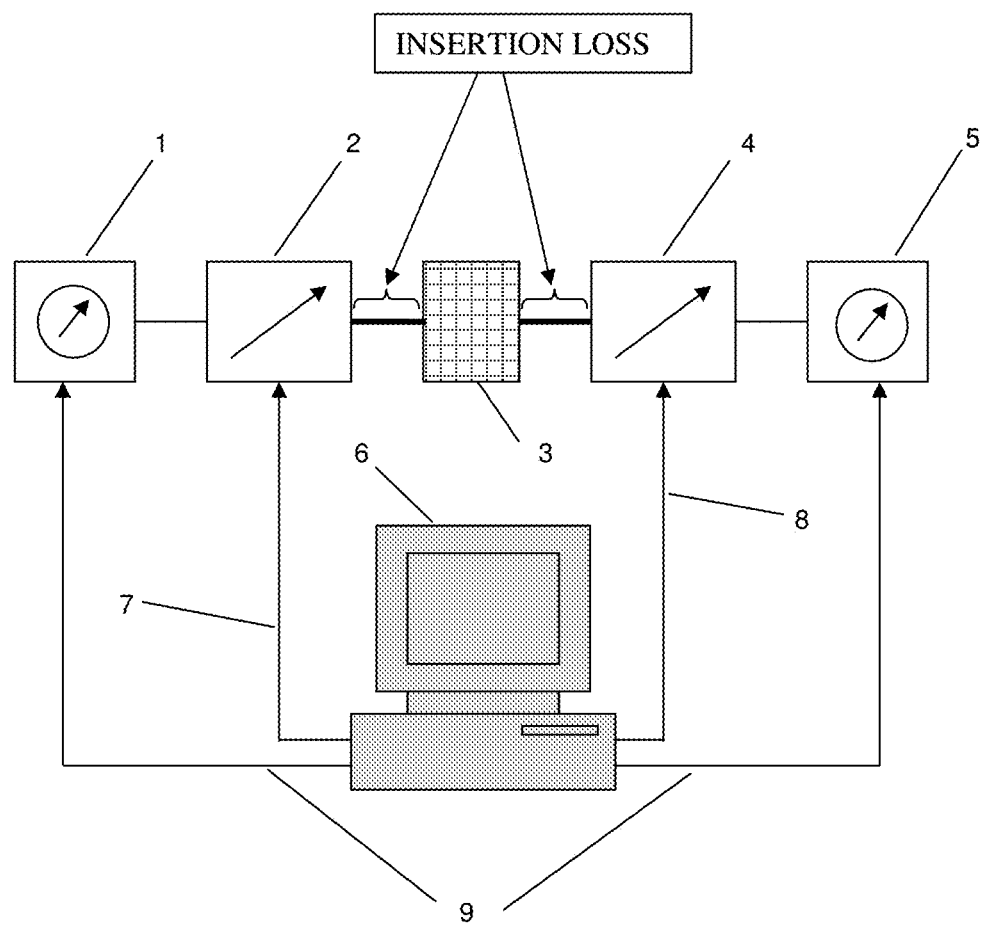
FIG. 1 depicts prior art, a typical automated load-pull test system.
Figure 2:
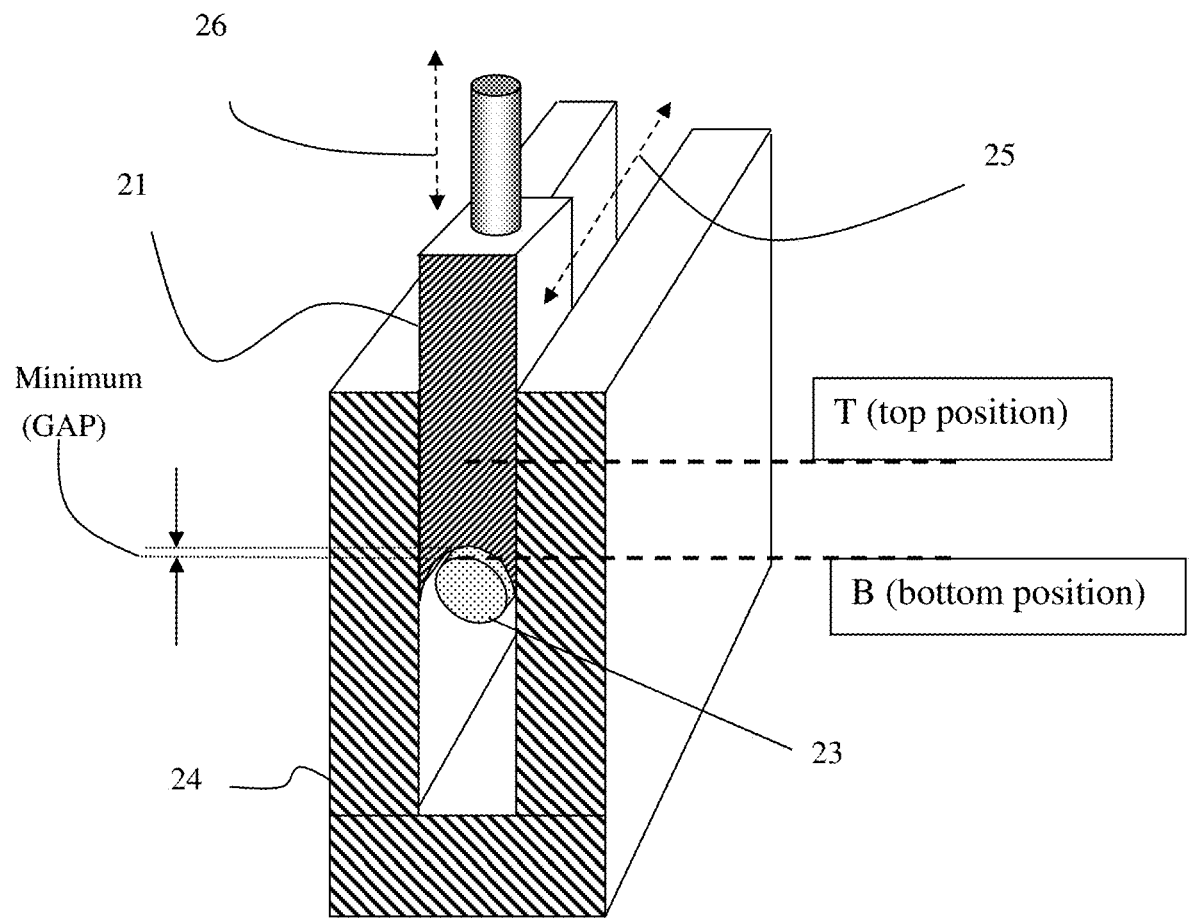
FIG. 2 depicts prior art, RF probe (slug) inside a slotted airline (slabline) approaching the center conductor in a perspective view and the relevant dimensions and parameters of the operation.
Figure 4:
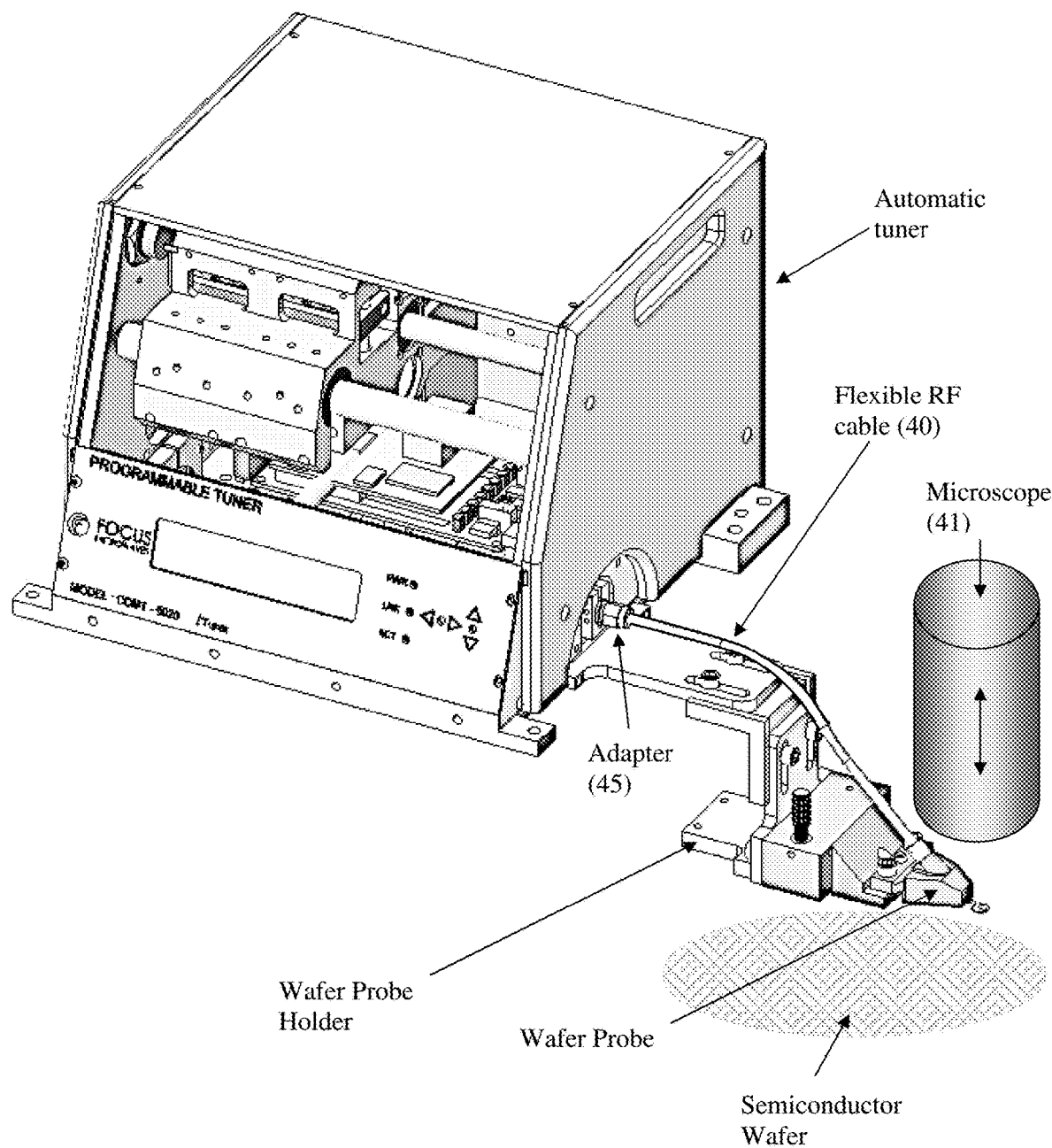
FIG. 4 depicts prior art: a tuner in on-wafer integration with a flexible or semi-rigid RF cable connecting to the wafer-probe.
Figure 5:
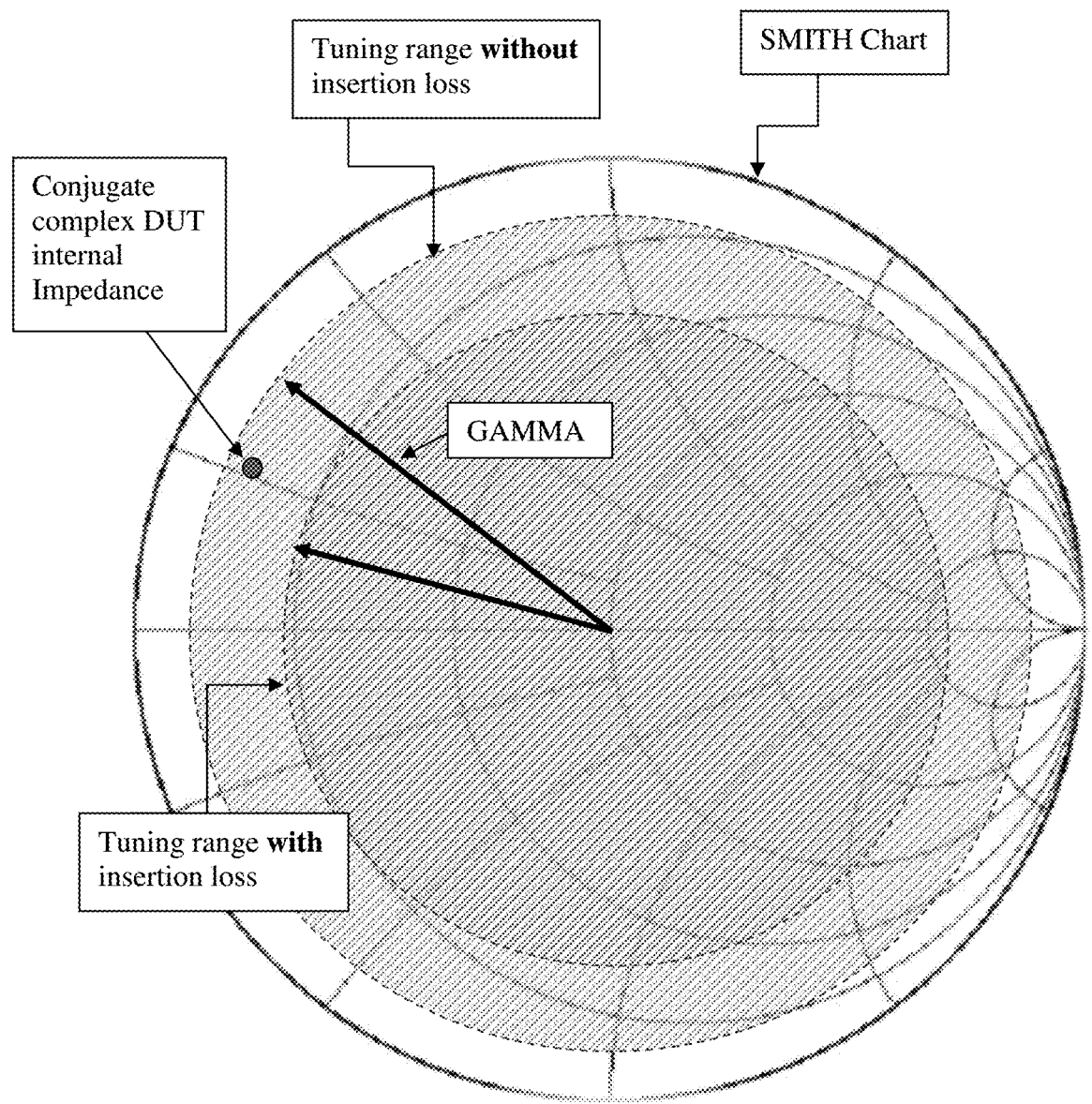
FIG. 5 depicts prior art: the effect of insertion loss (see FIG. 1) on tuning range at the DUT reference plane.

RF cable 40 and adapters 45 are needed to connect the DUT to the tuner and create insertion loss (FIGS. 1 and 4). Insertion loss reduces the tuning range twofold (FIG. 5): the energy generated by the DUT loses a portion on its way to the tuner; and it loses the same portion on its way back, since it is the ratio of reflected to injected power, which is defined as the reflection factor GAMMA, the maximum of which corresponds to the tuning range; or a 1 dB insertion loss reduces the tuning range by 2 dB; several DUT cannot be physically matched because of this, i.e. the tuner cannot reach the conjugate complex internal impedance of the DUT, which means the specific DUT cannot be tested by the specific load pull system. In particular the flexible RF cable 40 (FIG. 4) is far too lossy at millimeter-wave frequencies, introducing, typically, 2.5-3 dB insertion loss; to minimize the insertion loss, and increase the tuning range we can use extended air filled bent slabline, instead of the RF cable (FIG. 6); this solution offers: (a) lower insertion loss (because of the need for one less adapter 45 and, because the slotted airline (slabline) is the lowest loss solution, having air as dielectricum, instead of Teflon or other dielectric material used in RF cables), and (b) the possibility to integrate a manual pre-matching module on the slabline itself as close to the DUT as physically possible, thus further reducing insertion loss, shown by the dotted trace in FIG. 6.

Figure 3:
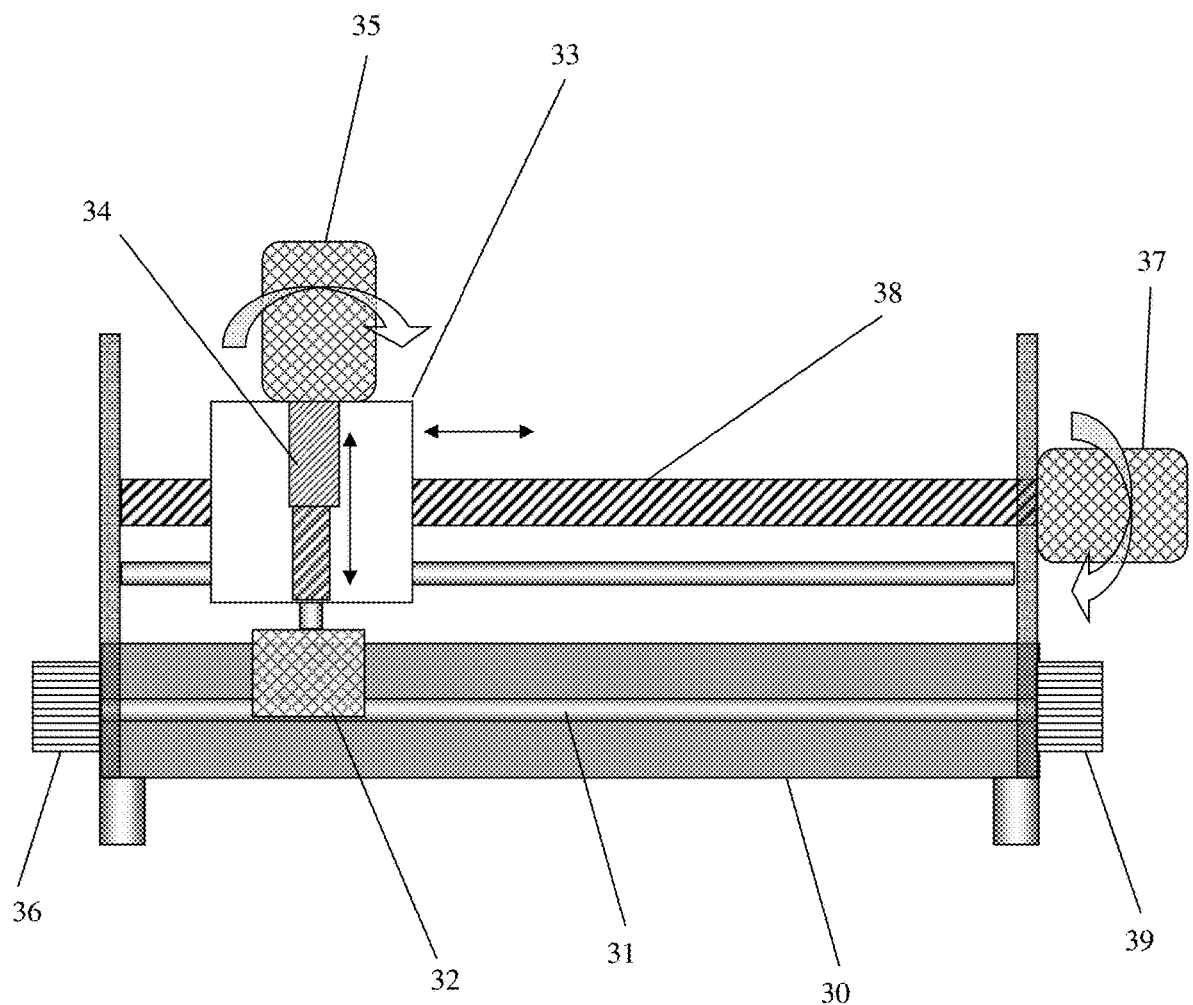
FIG. 3 depicts prior art, a front view of a manual slide screw impedance tuner using a single vertical axis and RF tuning probe (slug).
Figure 9:
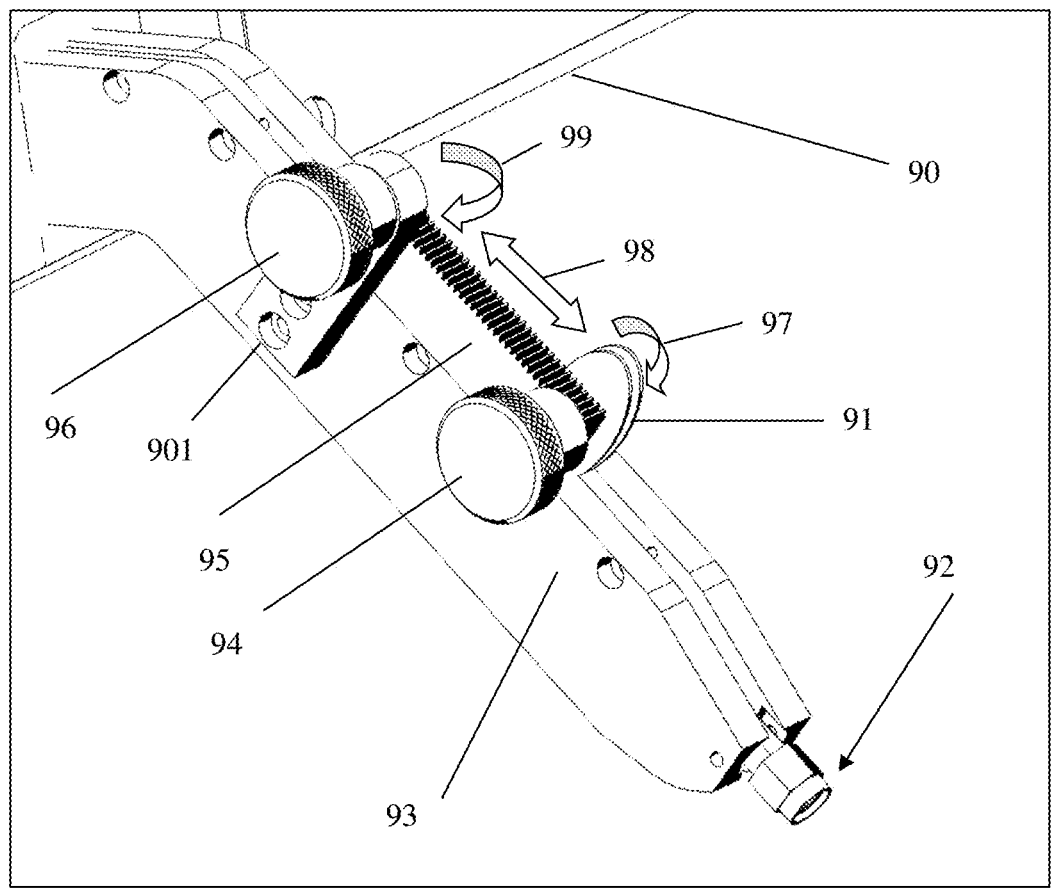
FIG. 9 depicts a perspective view of a manual pre-matching tuner module integrated into the extended slabline of an automated impedance tuner.

As already explained an integrated pre-matching module requires solving at least the two basic structural problems of prior art systems, i.e. (a) the vertical axis and (b) the horizontal control: (a) the vertical axis, as shown in FIGS. 3 and 17, by items 34, 35 and 170, is incompatible with the microscope 41, 69 in FIGS. 4 and 6; and (b) the horizontal control, as shown in FIG. 3 by items 38 and 37 and items 192 and 193 in FIG. 19, cannot be implemented on the inclined portion of the extended slabline, close to the wafer-probe, either, because of closeness of the tuner body 90 towards the top end, and towards the wafer-probe 92 on the bottom end (FIG. 9).

The pre-matching module is required and generates high reflection (VSWR) best for frequencies between 20 and 60-67 GHz (FIG. 12), where cable and slabline loss is high. The amplitude of the reflection factor GAMMA created by the module is related to the shown VSWR, see ref. 8, as follows: |GAMMA|=(VSWR−1)/(VSWR+1): therefore VSWR=15 corresponds to |GAMMA|=0.875. The minimum tunable resistance is Rmin=50Ω/VSWR, or VSWR=15 allows tuning to Rmin=3.3Ω. The pre-matching module comprises the following key components (FIGS. 7 to 10):

I. A rack 72, 95 that slides on the slabline wall, 74, 93;
II. An eccentrically rotating circular 85 or elliptic 71 or oval shaped 91 disc-probe, controlled by a side KNOB #2, 94, 105;
III. A fixed pinion 73, 103, attached to KNOB #1, 96, 104, that controls the lateral position 78 of the mobile rack 72, 95 horizontally on top of and along the slabline wall 74.

The high GAMMA pre-matching solution proposed in this invention is new; it comprises: (i) a rack and pinion mechanism to control the tuning probe, and (ii) a rotating disc tuning probe, all controlled by manual knobs placed on the side of the extended inclined slabline. The way the rack-and-pinion control mechanism is implemented here, is not the conventional one: In a conventional case the pinion assembly rolls on a fixed rack. In our case the axis 702 of the pinion 73 is fixed using the bracket 77 on the body of the slabline 74 on top of which the rack 72 is sliding. The disc-probe 71 on the other hand rotates around an axis 79, which traverses the rack 72 at one end item 107 in FIG. 10). This means that, when the rack slides along the axis of the slabline, it pulls 79 the disc-probe along 78. This controls the physical distance of the probe 71 from the test port 703 and thus the phase F of the reflection factor GAMMA seen at the test port 70. The eccentric 801 rotation of the disc-probe ensures adjustable penetration 701 of the probe into the slot of the slabline and coupling with the center conductor 76, and thus controls the amplitude |GAMMA| of the reflection factor.

Figure 10:
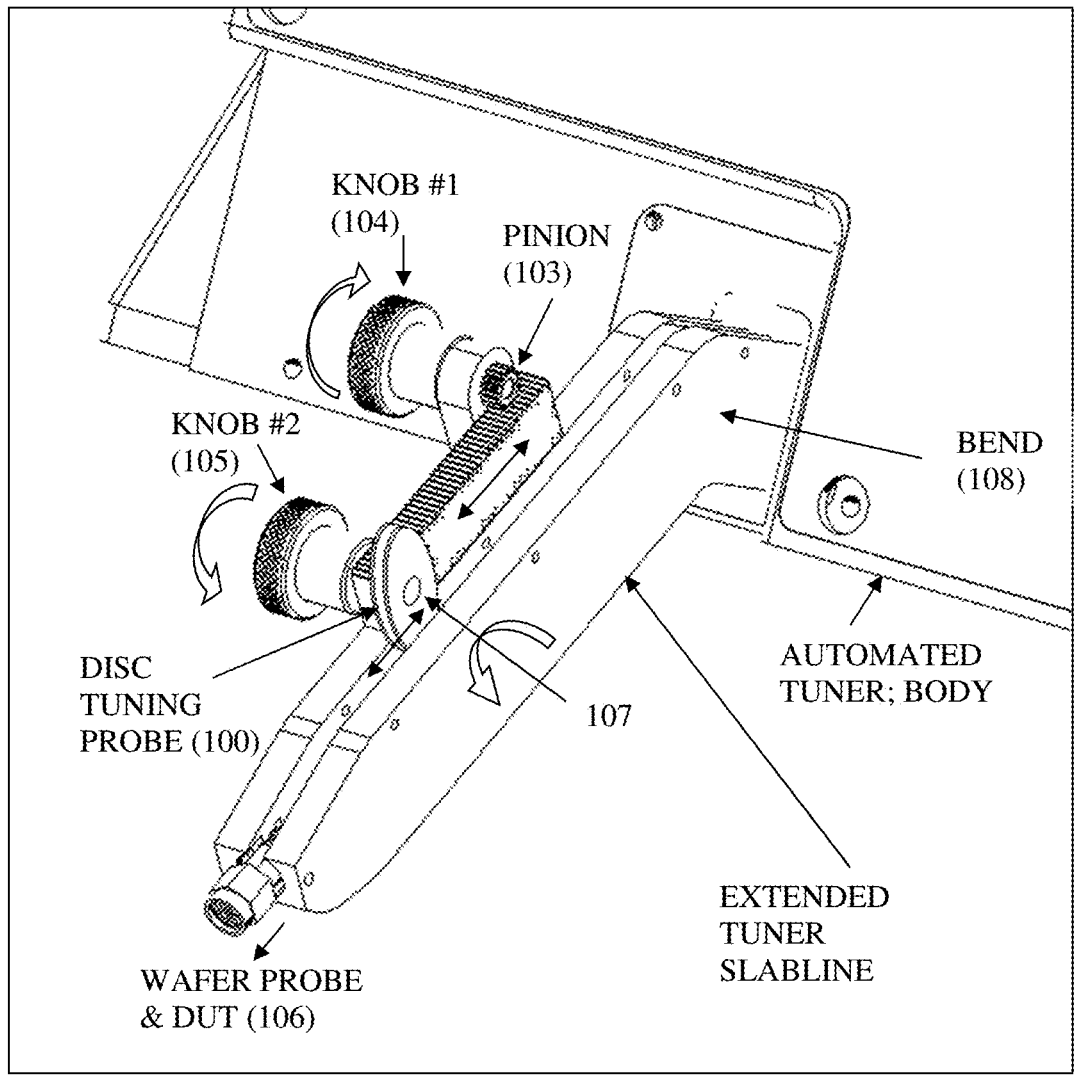
FIG. 10 depicts an opposite view of the tuner of FIG. 9, showing the exact manipulations.

Comparing with the prior art configuration of manual or automated slide screw tuners, (i) the rack 72 replaces the totality of the ACME rod 38 and the carriage 33 together as one item; and (ii) the eccentricity 801 of the disc-probe 71, 85 replaces the vertical axis mechanism 35, 34; therefore both the horizontal and vertical control mechanisms of the original probe 32 are now possible in an extremely low profile scheme, which makes the pre-matching tuning module 159 in FIG. 15, compatible with the microscope 1501 and accessible to manual control from one side only, using knobs #1, 104 and #2, 105, shown in FIG. 10 or 94 and 96 in FIG. 9.

The incompatibility of the prior art pre-matching module with integration on the bend-line is demonstrated FIG. 19A: The tall vertical axis and control screw conflict with the microscope. This would be the situation also in the setup of FIG. 17 if the pre-matching module were mounted on the inclined portion of the slabline—bend-line: the pre-matching module cannot be mounted on the sloped section of the bend-line. Other in FIG. 19B: here the flat profile of the pre-matching module allows mounting very low on the bend-line, quasi at the connector to the wafer-probe. The tuning probe 190 is also much closer to the DUT than the position of probe 191; the disc tuning probe 190 can almost reach the interface of the connector of the wafer-probe creating this way the lowest possible insertion loss and maximum tuning range.

Perspective views of the pre-matching tuning module are shown in FIGS. 9 and 10: The rack 95 is moving horizontally 98 controlled by the rotating 99 pinion 103 (FIG. 10). The pinion 103 is mounted on the bracket 901, which is permanently attached to the slabline wall 93. The pinion 103 only rotates, it does not move horizontally. The shaft 804 (FIG. 8) controls the rotation 97 of the disc tuning probe 91, traverses the rack perpendicularly 107 and is pulled 78, 98 by the rack 72, 95. Both movements are easily accessible manually from the side, using the two knurled knobs #1 item 104 and #2 item 105. The position of the fixed bracket 901 can be adjusted to be close to the wafer-probe connector 92 and for the disc-probe to be as close to the wafer-probe 131 and to the DUT as physically possible without conflicting with the microscope 130. The method gains importance at frequencies above a few GHz, where insertion loss of cables and bend-lines is high. Regarding actual dimensions, at a lowest frequency Fmin=6 GHz the required horizontal movement of half the wavelength is 25 mm (1″). This is easily compatible with the actual dimensions of typical tuners and wafer-probes (a wafer probe connector 106, for comparison has a body size of the (7.5 mm) and the bend-line of the prototype in FIG. 17 is approximately 90 mm long, meaning that the manual pre-matching module can be integrated on the bend-line and operate at 6 GHz or even below.

The benefit of mounting/inserting the pre-matching module 159 on the inclined portion of the extended tuner slabline, between the bend 108 and the wafer-probe 106 and not, as shown in the (unpublished) configuration of FIG. 17, between the bend and the tuner body, keeping in mind that the tall vertical axis in FIG. 17 also would conflict with the microscope 1501 (also FIG. 19A), becomes clear by comparing the evolution of insertion loss from the linearly increasing slopes at area 181 and 184 in FIG. 18: Insertion loss in transmission lines depends on the material and finishing of the conductors, in particular of the center conductor, and of the dielectric media used. Dry air (vacuum) has the lowest loss; insertion loss also depends on the geometry of the transmission media (here the center conductor). Like in any energy transmission a straight line has a minimum transmission loss. In the case of a bend-line (bent slabline) the center conductor is bent at the corner 108, close to the exit from the tuner body (FIG. 10). The insertion loss increases linearly 181 from the wafer-probe 106, corresponding to point 180 in FIG. 18, towards the pre-matching disc-probe 100 and on towards the bend 108. As can be seen in FIG. 18, at the bend 108 the insertion loss jumps upwards between the planes 182 and 183. Beyond the bend the insertion loss regains the original rising slope 184. It is therefore obvious that, to minimize insertion loss between DUT and pre-matching probe and maximize the tuning range 111 of the pre-matching module in FIG. 11, one must insert the pre-matching module before the bend 108, between wafer-probe 106 and bend 108.

Figure 11:
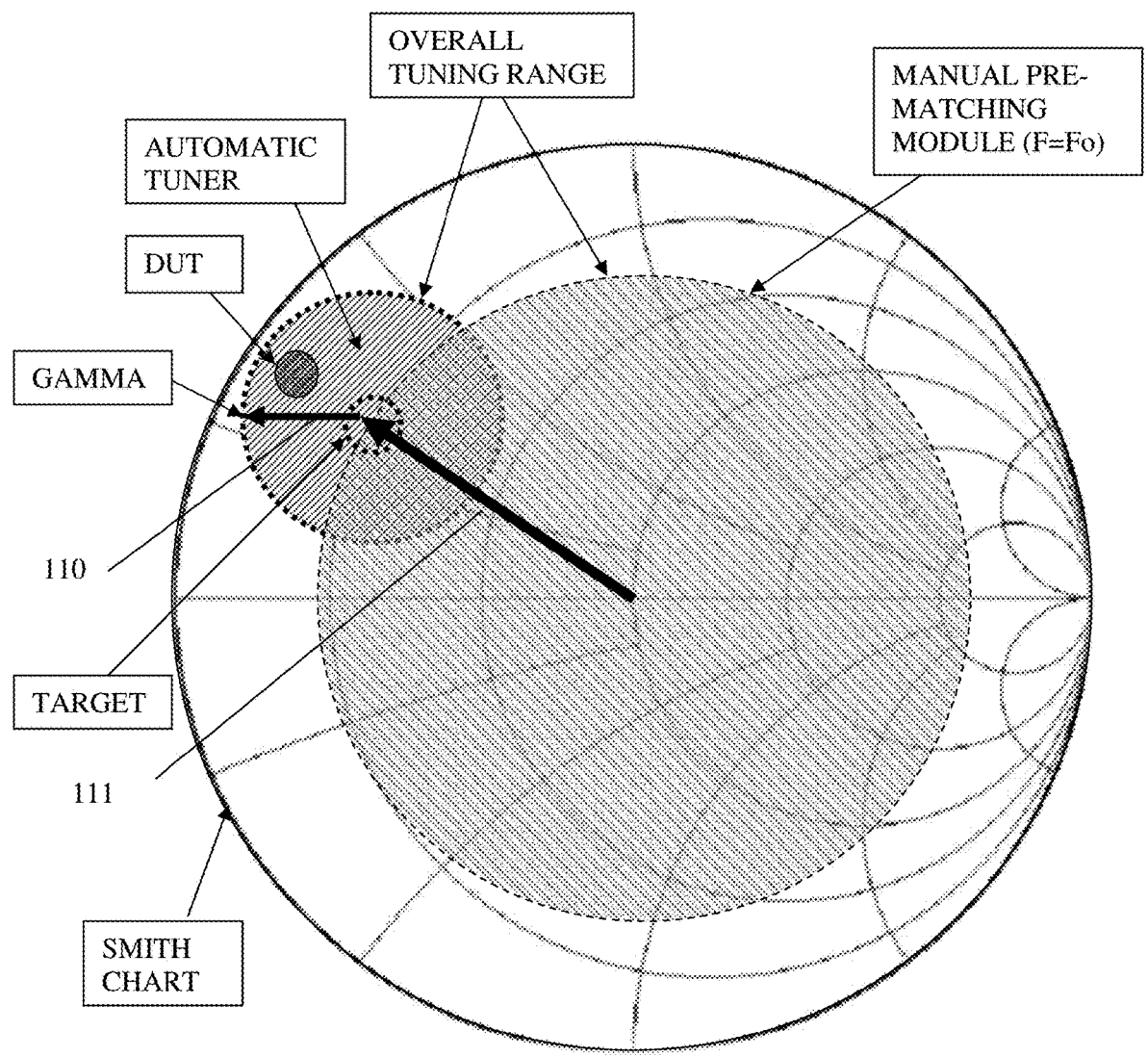
FIG. 11 depicts the pre-matching and automatic tuning mechanism on the Smith chart.

In real operation (FIG. 11) the tuning ranges shown are depicted for one frequency (Fo) as a function of tuning probe movement: the periphery of the circles corresponds to maximum probe insertion (capacitive coupling) and the surface of the circles corresponds to the complete tuning domain; the targeted maximum tuning range can be increased using the pre-matching module, which has a specific maximum tuning range, shown by the trace "MANUAL PRE-MATCHING MODULE (F=Fo)" for each frequency Fo as a function of tuning probe position, and as a function of frequency, for maximum tuning probe depth, as shown in FIG. 12; the tuning range can be increased by the pre-matching module in direction of the conjugate output reflection factor of the DUT, i.e. towards the TARGET area, vector 111 in FIG. 11; the automatic tuner, then can tune with vector 110 around the TARGET, i.e. the peak of the arrow 111 creating an overall tuning zone marked as "AUTOMATIC TUNER" in FIG. 11. This tuning zone then surrounds the DUT impedance. The remaining small distance between the maximum of the overall tuning zone and the periphery of the Smith chart is due to the loss of the adapter 92 between pre-matching module and wafer-probe and the wafer-probe itself.

The full on-wafer test setup is shown in detail in FIG. 15. Both tuners 1503 and 158 are mounted on 3-axis tuner positioners 150 and 156, which are mounted on a vibration free station block 151 (often a massive granite block). Each tuner has an extended bend-line 1502, 155 which are connected to wafer-probes 153. The semiconductor wafer 154 is mounted on a chuck 152, which can be adjusted in X, Y and Z to place the target chip under the tips of the wafer-probes, in the view field of the microscope 1501 and make and break contact. During testing the 3-axis positions do not move the tuners. Normally all movement X, Y and Z is done by the chuck, which places and replaces the proper chips under the probe tips and lifts it to establish contact. The 3-axis positioners only move the tuners for initial position or during calibration, or if another chip with different geometry shall be tested. In the setup it is obvious that the proximity of the pre-matching module 159 to the wafer-probe cannot be without conflict with the microscope 1501, if the said module had a tall vertical axis. Therefore low profile is imperative. The units 1504 and 157 in the setup comprise either summarily the test instruments or adapters leading to the (not shown) VNA. In either case such accessories in similar setups are well known in the art.

To be effectively used in testing on wafer semiconductor chips (transistors or amplifiers), the load pull system, must be calibrated before (see ref. 5). Calibration means, measuring the scattering (s-) parameters of all setup components, cascade and save them in computer memory, to be able to "de-embed" measured data from the test instrument level to the DUT reference plane. This includes calibrating the setup components, the instruments and the tuners, of which the tuner calibration is the most cumbersome, lengthy and ambitious operation, because its s-parameters change for each tuning probe position and depend on the mechanical stability and mechanical repeatability, in particular of the moving tuning probes.

Only automated tuners provide such repeatability. This is why the manual pre-matching module cannot be re-adjusted after it is calibrated. It is impossible to return to the same position manually. Other than in prior art therefore, this invention teaches configuring the manual pre-matching module first and calibrating the whole as an extended tuner later. As shown in the flow-chart of FIG. 16, the manual setting of the pre-matching module 1601 is a trial-and-error routine. It is impossible to manipulate the module manually using the knobs #1 and #2 while contacting the wafer-probe, since the unavoidable movement would break any probe. Therefore one has to calibrate 160, 161, 162 the wafer system first with all tuning probes withdrawn (automatic and manual), of tuners 1503 and 158 as well as the tuning probe of the module 159, so as to present a low loss through line to the test ports of the Vector Network Analyzer (VNA), which are connected to the joints 1504 and 157; this setup calibration is possible by introducing thru-reflect-line (TRL) calibration standards (see ref. 6) and apply TRL calibration software; it is important to note that TRL does not work if there are non-reciprocal components (isolators or circulators) in the loop between the VNA test ports; this operation serves to determine the exact network parameters (s-parameters) between the VNA test ports and the wafer-probe tips and then move the reference plane from the test ports of the VNA to the center of the THRU line between the wafer-probe tips, where the DUT will be inserted. After that, and before the DUT is inserted, one can observe the reflection factor GAMMA 1505 that "will be presented" by the pre-match 159 module and the (still initialized) tuner 158 to the DUT, measured through a THRU line on wafer, as shown in FIG. 15 trying to get, in a trial-and-error procedure, as close to the TARGET zone (FIG. 11) as possible.

The "trial-and-error" procedure executes as follows: First the user enters the TARGET value (amplitude and phase) and the pre-matching TOLERANCE, which, preferably, corresponds to the radius of the TARGET zone. The TARGET value is deductible either from, previously measured, small signal s-parameters of the DUT (in which case a starting point can be TARGET≈S22*), or from other source or experience. The smaller the TOLERANCE radius, the more trial-and-error iterations 1601 will be needed and the higher the probability to include the optimum DUT reflection factor in the test pattern, using the tuner. Next, in step 160, all tuning probes are withdrawn. Then the system is connected between the input port of an eventual input tuner 1503, FIG. 15 and (if there is no input tuner, directly to the input wafer probe 153) and the output port of the output tuner 158 to the test ports of a pre-calibrated VNA, step 161. Herein "pre-calibrated" means that the VNA is prepared and able to measure accurately at its (coaxial) test ports. Then, in step 162, a set of TRL (see ref. 6) standards are successively inserted between the wafer-probe tips, s-parameters are measured and TRL calibration methods are applied to extract the network parameters between the VNA test ports and the wafer-probe tips and embed to (cascade to . . . or shift the . . . ) the VNA test port reference planes. At this point any impedance present at the wafer-probe tips is correctly readable by the VNA.

In step 163 the wafer-probes are disconnected, pre-match is manually set by manipulating knobs #1 and #2 and verified after re-establishing contact with the THRU in step 164. If the generated reflection factor is outside the expected TARGET zone (FIG. 11) then the contact is broken, the wafer-probe associated with the pre-match module is lifted, the knobs #1 and #2 are re-arranged, contact is re-established, and the new GAMMA observed (loop 1601). This loop is repeated until a GAMMA inside the TARGET zone is generated, in step 165. From there on, the knobs #1 and #2 are secured and immobilized.

After this manual trial-and-error cycle 1601, tuner calibration, known from prior art, is executed (step 167), by measuring s-parameters for a plurality of horizontal and vertical positions of the tuning probe (see ref. 7) of the automatic tuner "through" the already settled and secured manual pre-match; this creates a typical tuning surface, as the one marked "AUTOMATIC TUNER" in FIG. 11. A more general "de-embedding" calibration (see ref. 2, column 6, lines 1-27 and claims 5 and 6) is here not possible, because the "manual" control of the pre-matching module does not allow precise re-positioning of the horizontal and vertical status of the disc-probe (or of any manually controlled tuning probe, in fact). The calibration of the pre-matched tuner terminates in step 166 with saving the calibration data in step 167, ready for retrieval in a load pull test procedure, in step 168, after inserting a DUT, re-connecting to it, biasing it and adjusting the operation of all adjacent test instruments as known from prior art (see ref. 1) and saving the measured data in step 169.

This invention has been disclosed in a basic preferred embodiment; obvious alternatives and configurations, to the concept of an integrated pre-matched on wafer load pull system for millimeter-wave frequencies using manually adjustable low profile pre-matching module with rotating disc probe, are possible but shall not impede on to the validity of the present invention.

What I claim as my invention is:

1. A high GAMMA on-wafer load-pull test system, comprising
    at least one automated tuner,
    a manual, low profile pre-matching module,
    a wafer-probe-station, input and output wafer-probes and associated test instruments,
    at least one 3-axis tuner positioner,
    a control computer, calibration and test software;
    wherein
    the at least one tuner has an extended bent slabline (bend-line) directly connected to a wafer-probe,
    and wherein
    the low-profile module is mounted on the bend-line between the bend and the wafer-probe;
    and wherein
    the wafer-probe connects to a DUT, and
    the tuner position is controlled by the 3-axis positioner.
2. The tuner as in claim 1, comprising
    a housing, a test port and an idle port, and
    a slotted airline (slabline) between the ports,
        said slabline having two vertical sidewalls and a center conductor; and
    a remotely controlled mobile carriage movable along the slabline,
        said carriage comprising a remotely controlled vertical axis,
        said vertical axis holding a metallic tuning probe insertable into the slot of the slabline;
    wherein
        the slabline extends beyond the housing of the tuner towards the test port and comprises a straight and an inclined section; wherein the inclined section is bent to match the angle of the wafer-probe;
    and wherein
        the low-profile manual pre-matching tuning module is mounted on the inclined section of the slabline extension between the bend and the test port.
3. The extended bent slabline as in claim 2 being bent as close to the tuner housing as possible.
4. The tuner of claim 2 mounted on the wafer-probe station using the 3 axis (X-Y-Z) tuner positioner.
5. The manual pre-matching module as in claim 2, comprising
    a rack,
    a pinion,
    an eccentrically rotating disc tuning probe,
    two control knobs #1 and #2;
    wherein
    the rack slides on top of one wall of the slabline along the axis of the slabline;
    the pinion is attached to the same wall and controls the position of the rack;
    the disc probe rotates around an axis inserted into a perpendicular hole in the rack;
    the rotation of the pinion and of the axis of the disc probe are controlled by knobs #1 and #2,
    wherein
    knob #1 controls the pinion and the position of the rack along the slabline, and
    knob #2 controls the rotation angle of the disc probe.
6. The rack and the two knobs as in claim 5 being mounted on the slabline wall facing the operator.
7. A calibration and testing method for the system of claim 5, comprising the following steps:
    i) enter a TARGET reflection factor zone and a TOLERANCE;
    ii) connect a pre-calibrated VNA to an output port of the tuner and to an opposite wafer-probe;
    iii) withdraw the tuning probes of all tuners and the disc-probe of the pre-matching module (initializing);
    iv) calibrate the system using TRL at the wafer-probe tips, and insert a short THRU line between the wafer-probes;
    v) break contact of the wafer-probe attached to the slabline of the tuner;
    vi) manually adjust the knobs #1 and #2 to create a pre-matching reflection factor GAMMA, seen through the THRU;
    vii) connect the wafer-probe of step v) to the THRU line;
    viii) compare GAMMA with TARGET and repeat steps v) through vii) until the difference |GAMMA−TARGET|<TOLERANCE;
    ix) secure the positions of knobs #1 and #2;
    x) calibrate the tuner between the wafer-probe tip and the VNA test port for a plurality of tuning probe positions and save;
    xi) disconnect both wafer-probes and insert the DUT;
    xii) connect both wafer-probes to the DUT, DC bias and execute load pull testing using the tuner and the calibration data of step x).

* * * * *